United States Patent
Li et al.

(10) Patent No.: US 10,784,353 B2
(45) Date of Patent: Sep. 22, 2020

(54) LATERAL HETEROJUNCTIONS BETWEEN A FIRST LAYER AND A SECOND LAYER OF TRANSITION METAL DICHALCOGENIDE

(71) Applicant: KING ABDULLAH UNIVERSITY OF SCIENCE AND TECHNOLOGY, Thuwal (SA)

(72) Inventors: Lain-Jong Li, Thuwal (SA); Hao-Ling Tang, Thuwal (SA); Ming-Hui Chiu, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 0 days.

(21) Appl. No.: 16/342,432

(22) PCT Filed: Nov. 15, 2017

(86) PCT No.: PCT/IB2017/057118
§ 371 (c)(1),
(2) Date: Apr. 16, 2019

(87) PCT Pub. No.: WO2018/092025
PCT Pub. Date: May 24, 2018

(65) Prior Publication Data
US 2020/0058743 A1 Feb. 20, 2020

Related U.S. Application Data

(60) Provisional application No. 62/422,984, filed on Nov. 16, 2016.

(51) Int. Cl.
*H01L 29/267* (2006.01)
*H01L 29/16* (2006.01)
(Continued)

(52) U.S. Cl.
CPC ........ *H01L 29/267* (2013.01); *H01L 29/1606* (2013.01); *H01L 29/24* (2013.01);
(Continued)

(58) Field of Classification Search
CPC ............. H01L 29/267; H01L 29/78696; H01L 29/78684; H01L 29/78618; H01L 29/7606;
(Continued)

(56) References Cited

U.S. PATENT DOCUMENTS 5,162,891 A * 11/1992 Burroughes .... H01L 31/022408
257/183
8,906,787 B2 12/2014 Park et al.
(Continued)

FOREIGN PATENT DOCUMENTS

CN 102270692 A 12/2011
CN 103928340 A 7/2014
(Continued)

OTHER PUBLICATIONS

Gong et al. ("Vertical and in-plane heterostructures from WS2/MoS2 monolayers", Nature Materials, vol. 13, No. 12, 1 Jan. 1, 2014) (Year: 2014).*
(Continued)

*Primary Examiner* — Yasser A Abdelaziez
(74) *Attorney, Agent, or Firm* — Patent Portfolio Builders PLLC

(57) ABSTRACT

A device comprising: at least one first layer, such as a graphene layer, at least one second layer of transition metal dichalcogenide, wherein the at least one first layer and the at least one second layer of transition metal dichalcogenide form at least one heterojunction. The first and second layers are laterally displaced but may overlap over a length of 0 nm to 500 nm. A low-resistance contact is formed. The device (Continued)

can be a transistor including a field effect transistor. The layers can be formed by chemical vapor deposition. The graphene can be heavily p-doped. Transistor performance data are described.

19 Claims, 12 Drawing Sheets

(51) Int. Cl.
    *H01L 29/24*     (2006.01)
    *H01L 29/66*     (2006.01)
    *H01L 29/76*     (2006.01)
    *H01L 29/786*     (2006.01)

(52) U.S. Cl.
    CPC .... *H01L 29/66045* (2013.01); *H01L 29/7606* (2013.01); *H01L 29/78618* (2013.01); *H01L 29/78684* (2013.01); *H01L 29/78696* (2013.01)

(58) Field of Classification Search
    CPC ............... H01L 29/66045; H01L 29/24; H01L 29/1606; H01L 29/778; H01L 29/41725; H01L 29/78681; H01L 29/78603; H01L 29/401; H01L 29/517; H01L 29/861; H01L 29/66742
    See application file for complete search history.

(56) References Cited

U.S. PATENT DOCUMENTS

| | | |
|---|---|---|
| 2014/0197459 A1 | 7/2014 | Kis et al. |
| 2015/0102807 A1 | 4/2015 | Eckinger et al. |
| 2015/0318401 A1* | 11/2015 | Duan .................. H01L 29/7869 250/200 |
| 2016/0155971 A1 | 6/2016 | Strachan et al. |
| 2016/0284811 A1 | 9/2016 | Yu et al. |
| 2019/0172960 A1* | 6/2019 | He ...................... H01L 31/0392 |

FOREIGN PATENT DOCUMENTS

| | | |
|---|---|---|
| EP | 2869348 A1 | 5/2015 |
| WO | 2015031461 A1 | 3/2015 |

OTHER PUBLICATIONS

Komsa et al. ("Two-dimensional transition metal dichalcogenide alloys: stability and electronic properties," J. Phys. Chem. Letter, 3, pp. 3652-3656) (Year: 2012).*

Bae, S., et al.; "Roll-to-roll production of 30-inch graphene films for transparent electrodes"; Nature Nanotechnology, vol. 5, Aug. 2010; pp. 574-578.

Chang, H. Y., et al., "On the mobility and contact resistance evaluation for transistors based on MoS2 or two-dimensional semiconducting atomic crystals"; Applied Physics Letters, 104, Mar. 17, 2014; pp. 113504-1 to 113504-5.

Chhowalla, M., et al.; "The chemistry of two-dimensional layered transition metal dichalcogenide nanosheets"; Nature Chemistry, vol. 5, Apr. 2013; pp. 263-275.

Chuang, H.J.; "High Mobility WSe2 p- and n-Type Field-Effect Transistors Contacted by Highly Doped Graphene for Low-Resistance Contacts"; Nano Letters, 14; May 20, 2014; pp. 3594-3601.

Dong, X., et al.; "Doping Single-Layer Graphene with Aromatic Molecules**"; Small, vol. 5, Issue 12, Jun. 19, 2009; pp. 1422-1426.

Elias, D. C., et al.; "Control of Graphene's Properties by Reversible Hydrogenation: Evidence for Graphene"; Science, vol. 323, Jan. 30, 2009; pp. 610-613.

Fang, H., et al.; "High-Performance single Layered WSe2, p-FETs with Chemically Doped Contacts" Nano Letters, 12; Jun. 14, 2012; pp. 3788-3792.

Georgiou, T., et al.; "Vertical field-effect transistor based on graphene-WS2 heterostructures for flexible and transparent electronics"; Nature Nanotechnology, vol. 8, Feb. 2013; pp. 100-103.

Huang, J.K., et al., "Large-Area Synthesis of Highly Crystalline WSe2 Monolayers and Device Applications"; ACS Nano, vol. 8, No. 1, Dec. 14, 2013; pp. 923-930.

Yu, W. J., et al.; "Vertically stacked multi-heterostructures of layered materials for logic transistors and complementary inverters"; Nature Materials, vol. 12; Mar. 2013; pp. 246-252.

Kim, K. K., et a.; "Enhancing the conductivity of transparent graphene films via doping"; Nanotechnology, 21, Jun. 28, 2010; pp. 1-21.

Levendorf, M., et al.; "Graphene and boron nitride lateral heterostructures for atomically thin circuitry"; Nature, vol. 488; Aug. 30, 2012; pp. 627-632.

Li, M.Y., et al.; "Epitaxial growth of a monolayer WSe2-MoS2 lateral p-n junction with an atomically sharp interface"; Science, vol. 349, Issue 6247, Jul. 31, 2015; pp. 524-528.

Lin, Y. C., et al.; "Wafer-scale MoS2 thin layers prepared by MoO3 sulfurization"; Nanoscale, 4, Aug. 29, 2012; pp. 6637-6641.

Liu, H., et al.; "Phosphorene: An Unexplored 2D Semiconductor with a High Hole Mobility"; ACS Nano, vol. 8, No. 4, Mar. 17, 2014; pp. 4033-4041.

Liu, W., et al.; "Role of Metal contacts in designing High-Performance Monolayer n-Type WSe2 Field Effect Transistors"; Nano Letters, 13; Mar. 25, 2013; pp. 1983-1990.

Loan, P. T. K., et al.; "Graphene/MoS2 Heterostructures for Ultrasensitive Detection of DNA Hybridisation"; Advanced Materials, 26, May 19, 2014; pp. 4838-4844.

Moore, A. L., et al.; "Emerging challenges and materials for thermal management of electronics"; Materials Today, vol. 17, No. 4, May 2014; pp. 163-174.

Perera, M. M., et al.; "Improved Carrier Mobiity in Few-Layer MoS2 Field-Effect Transistors with Ionic-Liquid Gating"; ACS Nano, vol. 7, No. 5, Apr. 16, 2013; pp. 4449-4458.

Xing, M., et al.; "Highly-dispersed Boron-doped Graphene Nanosheets Loaded with TiO2 Nanoparticles for Enhancing CO2 Photoreduction"; Scientific Reports 4:6341; Sep. 2011; pp. 1-7.

Zhou, X., et al.; "Synthesis of MoS2 nanosheet-graphene nanosheet hybrid materials for stable lithium storage"; Chem.Commun., 49; Jan. 2013; pp. 1838-1840.

Britnell, L., et al., "Field-Effect Tunneling Transistory Based on Vertical Graphene Heterostructures," Science, Feb. 24, 2012, vol. 335, pp. 947-950.

Gong, Y., et al., "Vertical and In-Plane Heterostructures from WS2/MoS2 Monolayers," Nature Materials, Sep. 28, 2014, vol. 13, No. 12.

Huang,C., et al., "Lateral Heterojunctions Within Monolayer MoSe2-WSe2 Semiconductors," Aug. 24, 2014, vol. 13, No. 2, pp. 1096-1101.

International Search Report in corresponding/related International Application No. PCT/IB2017/057118, dated Jan. 25, 2018.

Written Opinion of the International Searching Authority in corresponding/related International Application No. PCT/IB2017/057118, dated Jan. 25, 2018.

Chen, D., et al.; "Graphene-like layered metal dichalcogenide/ graphene composites: synthesis and applications in energy storage and conversion"; Materials Today, vol. 17, No. 4; May 2014; pp. 184-193.

Duesberg, G., "A perfect match"; Nature Materials, vol. 13; Dec. 2014; pp. 1075-1076.

Logoteta, D., et al.; "Graphene-based lateral heterostructure transisotros exhibit better intrinsic performance than graphene-based vertical transistors as post-CMOS devices"; Scientific Reports, 4:6607; Oct. 20, 2014; pp. 1-8.

Yu, et al.; "Graphene/MoS2 Hybrid Technology for Large-Scale Two-Dimensional Electronics"; Nano Letters, 14; American Chemical Society (ACS), May 8, 2014; pp. 3055-3063.

(56) References Cited

OTHER PUBLICATIONS

Zhang, W., et al.; "Ultrahigh-Gain Photodetectors Based on Atomically Thin Graphene-MoS2 Heterostructures"; Scientific Reports 4:3826; Jan. 23, 2014; pp. 1-8.
Zhang, X.Q., et al.; "Synthesis of Lateral Heterostructures of Semiconducting Atomic Layers"; Nano Letters 2015:15, American Chemical Society (ACS); Dec. 11, 2014; pp. 410-415.

* cited by examiner

LATERAL HETEROJUNCTIONS BETWEEN A FIRST LAYER AND A SECOND LAYER OF TRANSITION METAL DICHALCOGENIDE

BACKGROUND

Two dimensional nanostructures are becoming increasingly important for next generation semiconductor technology. For example, transition metal dichalcogenides (TMDs) such as $MoS_2$ and $WSe_2$ have been recognized as two-dimensional monolayer semiconductors which are promising for advanced electronics and opto-electronics (including meeting the targets of ITRS roadmaps for smaller semiconductor sizes). One major challenge for developing TMD-based electronic devices is that TMDs such as $WSe_2$ tend to form a substantial Schottky barrier (SB) with commonly used contact metals. One approach is to adopt extreme high or low work function metal such as Palladium (Pd) or Indium (In) [W. Liu et al., Nano Lett., 13, p. 1983, 2013]. Another approach is applying doping processes such as chemical ($NO_2$) doping [H. Fang et al., Nano Lett., 12, p. 3788, 2012] and ionic-liquid gating [H. J. Chuang et al., Nano Lett., 14, p. 3594, 2014; "Chuang reference"]. These approaches are not achieving enough low resistance and are not compatible with modern solid state electronics due to poor doping stability, low thermal stability of indium, and slow switching speed, respectively.

Graphene and boron nitride lateral heterostructures are known. See, for example, Levendorf et al., "Graphene and Boron Nitride Lateral Heterostructures for Atomically Thin Circuitry," Nature, 488, 627-632, Aug. 30, 2012; and U.S. Pat. No. 8,906,787.

Use of TMDs in a transistor is described in US Patent Publication 2014/0197459. Articles which refer to vertical TMD-graphene heterostructures include: Britnell et al., Science, 2012, 335 (6071), 947; Yu et al., Nat. Mater. 2013, 12 (3), 246; and Georgiou et al., Nat. Nanotechnol., 2013, 8 (2), 100. See also, Loan et al., Advanced Materials, 26, 28, 2014, 4838 (graphene/$MoS_2$ heterostructural stacking film). CN 103928340 and CN 102270692 also describe graphene structures.

Despite these advances, a need exists for better two-dimensional devices based on TMDs with improved Schottky barrier properties enabling more progress in the miniaturization of electronic and opto-electronic devices.

SUMMARY

Aspects and embodiments described herein include devices and articles, methods of making such devices and articles, and methods of using such devices and articles.

A first aspect provides for a device comprising: at least one first layer, wherein the first layer has a thickness of 20 nm or less; at least one second layer, different from the first, which is a transition metal dichalcogenide layer, wherein the second layer has a thickness of 20 nm or less; wherein the at least one first layer and the at least one second layer form at least one lateral heterojunction.

In one embodiment, the lateral heterojunction is a lateral penetrating heterojunction.

In one embodiment, the lateral heterojunction is a lateral penetrating heterojunction characterized by a penetration length which is from 1 nm to 500 nm.

In one embodiment, the lateral heterojunction is characterized by an overlapped length which is from 0 nm to 500 nm.

In one embodiment, the lateral heterojunction is characterized by an overlapped length which is from 1 nm to 500 nm.

In one embodiment, the first layer is a graphene layer, a boron nitride layer, a phosphorene layer, or a transition metal dichalcogenide layer which is different from the second layer.

In one embodiment, the first layer is an un-doped graphene layer, a p-doped graphene layer, or an n-doped graphene layer.

In one embodiment, the first layer is a p-doped graphene layer or an n-doped graphene layer, and the second layer is a p-type transition metal dichalcogenide or an n-type transition metal dichalcogenide.

In one embodiment, the device comprises at least two domains for the first layer, and each of the two domains are in contact with the second layer of transition metal dichalcogenide to form at least two lateral heterojunctions.

In one embodiment, the device comprises at least two domains for the first layer, and each of the two domains are in contact with the second layer of transition metal dichalcogenide to form at least two lateral heterojunctions. The lateral heterojunctions can be lateral interpenetrating junctions.

In one embodiment, the device comprises at least two domains for the first layer, wherein one of the two domains is in contact with the second layer which is an n-type second layer, and the other of the two domains is in contact with the second layer which is a p-type second layer.

In one embodiment, the device is a transistor, a photosensor, a solar cell, or a light-emitting diode.

Another aspect is a method of making the device(s) as described and/or claimed herein comprising forming on a substrate the at least one first layer, forming the at least one second layer, different from the first, with seed growth from the first layer, wherein the at least one first layer and the at least one second layer form at least one lateral heterojunction.

In one embodiment, the forming step for the second layer comprises chemical vapor deposition or physical vapor deposition, and wherein the forming step for the first layer comprises patterning the first layer.

In one embodiment, the method of patterning the first layer comprises dry etching or wet etching.

Another aspect provides for a structure or a device comprising: at least one first layer, wherein the first layer has a thickness of 20 nm or less, at least one second layer, different from the first, which is a transition metal dichalcogenide (TMD) layer, wherein the second layer has a thickness of 20 nm or less, wherein the at least one first layer and the at least one second layer form at least one lateral penetrating heterojunction.

More particularly, another aspect provides for a structure or device comprising: at least one graphene layer, and at least one layer of transition metal dichalcogenide, wherein the at least one graphene layer and the at least one layer of transition metal dichalcogenide form at least one lateral penetrating heterojunction.

In one embodiment, the first layer is a graphene layer, a boron nitride layer, a phosphorene layer, or a transition metal dichalcogenide layer which is different from the second layer. In one embodiment, the first layer is a graphene layer, whereas in another embodiment, the first layer is a phosphorene layer, whereas in another embodiment, the first layer is a transition metal dichalcogenide layer which is different from the second layer.

In one embodiment, the first layer is an un-doped graphene layer, a p-doped graphene layer, or an n-doped graphene layer. In one embodiment, the first layer is a p-doped graphene layer or an n-doped graphene layer, and the second layer is a p-type transition metal dichalcogenide or an n-type transition metal dichalcogenide. In one embodiment, the first layer is a p-doped graphene layer. In one embodiment, the first layer is an n-doped graphene layer. In one embodiment, the second layer is a p-type transition metal dichalcogenide. In one embodiment, the second layer is an n-type transition metal dichalcogenide.

In one embodiment, the lateral penetrating heterojunction is characterized by a penetration length which is from 1 nm to 500 nm.

In one embodiment, the device comprises at least two domains for the first layer, and each of the two domains are in contact with the second layer of transition metal dichalcogenide to form at least two lateral interpenetrating heterojunctions.

In one embodiment, the device comprises at least two domains for the first layer, wherein one of the two domains is in contact with the second layer which is an n-type second layer, and the other of the two domains is in contact with the second layer which is a p-type second layer.

In one embodiment, the device is, for example, a transistor, a photo-sensor, a solar cell, or a light-emitting diode.

Methods of making this device are also provided. For example, one embodiment provides for a method of making the device as described and/or claimed herein comprising forming on a substrate the at least one first layer, forming the at least one second layer, different from the first, with seed growth from the first layer, wherein the at least one first layer and the at least one second layer form at least one lateral penetrating heterojunction.

In one embodiment, the forming step for the second layer comprises chemical vapor deposition or physical vapor deposition, and wherein the forming step for the first layer comprises patterning the first layer. In one embodiment, the forming step for the second layer comprises chemical vapor deposition or physical vapor deposition. In another embodiment, the forming step for the first layer comprises patterning the first layer.

In one embodiment, the method of patterning the first layer comprises dry etching or wet etching. In one embodiment, the patterning comprises dry etching; in another embodiment, it comprises wet etching.

In a preferred embodiment, a low-resistance contact can be achieved with the lateral heterojunction of monolayer $WSe_2$ as the second layer and heavily p-doped graphene as the first layer. In a preferred embodiment, heavily p-doped graphene laterally connected to $WSe_2$ serves as a good contact material. Base on this preferred embodiment, a $WSe_2$ p-FET has been fabricated successfully on a patterned graphene sheet. In preferred embodiments, a p-FET based on such low-resistance contact structures can be used for high-performance electronics and opto-electronics based on these ultrathin monolayer semiconductors.

The inventive structures and devices can pave the way in at least some embodiments for sub 5 nm node integrated circuit technology by using an atomically thin channel. Good transfer and output characteristics can be achieved for at least some embodiments. Also, good thermal stability can be achieved for at least some embodiments. Preferred methods are IC compatible and can be integrated with, for example, graphene roll to roll methods.

BRIEF DESCRIPTION OF THE DRAWINGS

FIG. 1(a) provides a schematic example for the growth of (a) graphene, and (b) $WSe_2$ in hot wall furnaces. Graphene was synthesized on copper foil using $CH_4$ carried by $Ar/H_2$ at 800-1,100° C. For the $WSe_2$ monolayer, the $WO_3$ and Se powders were used as the precursors, and the growth was performed at 600-1,000° C.

FIG. 2(a) shows schematic illustration for the process flow to form graphene-$WSe_2$ lateral heterostructures. (b), (c) Top view OM images presenting patterned graphene before and after $WSe_2$ CVD growth respectively (graphene labelled as G and $WSe_2$ labelled as W). (d)-(e) Raman spatial mappings of (d) graphene G band and (e) $WSe_2$ E' band respectively. (f) Raman spectra of graphene before and after $WSe_2$ CVD growth. (g)-(h) The point PL and Raman spectra of $WSe_2$ respectively.

DETAILED DESCRIPTION

Introduction

Figure 1:
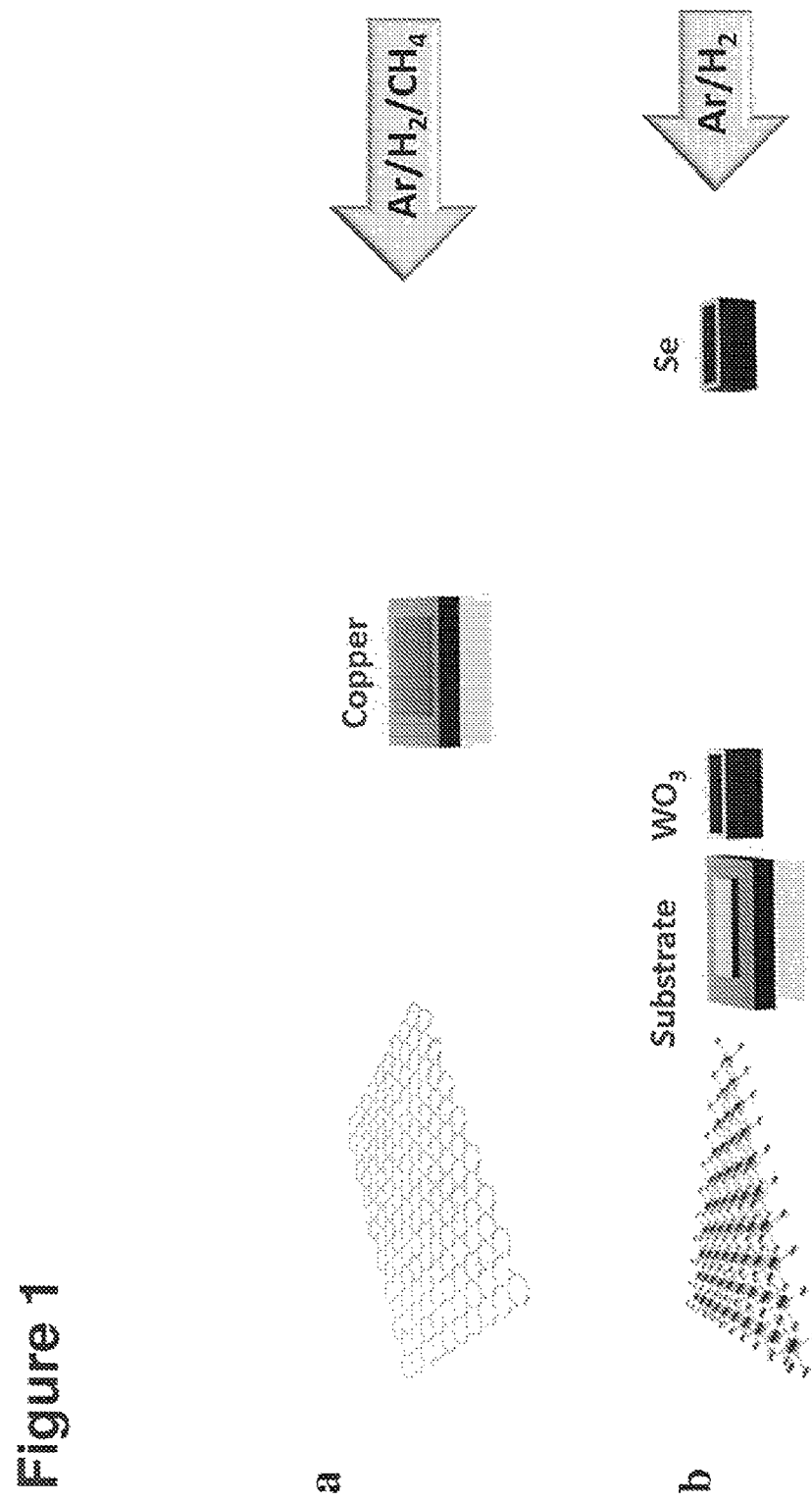
FIGS. 1(a)-(b).
Figure 2:
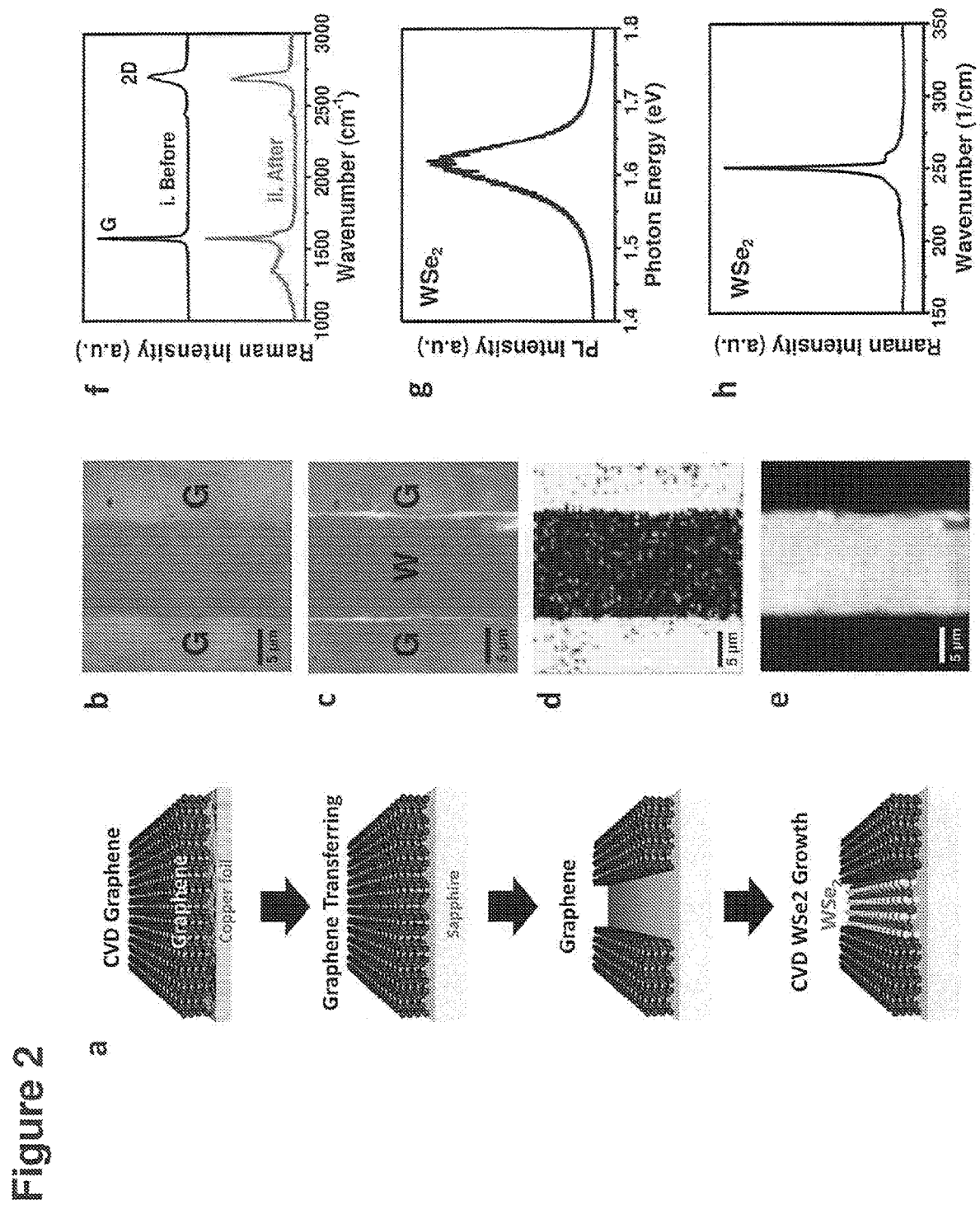
FIGS. 2(a)-(h).

This application is a U.S. National Stage Application of International Application No. PCT/IB2017/057118, filed on Nov. 15, 2017, which claims priority and benefit from U.S. provisional application Ser. No. 62/422,984 filed Nov. 16, 2016 which are hereby incorporated by reference in their entirety for all purposes including the working examples, FIGS. 1-17, and claims.

All references cited herein are incorporated herein by reference.

Additional description for the elements of the aspects and embodiments summarized above are provided below.

First Layer Including a Graphene Layer

The first layer can be a conducting, semiconducting, or insulating layer. The first layer can be, for example, a graphene layer, a boron nitride layer, a phosphorene layer, or a transition metal dichalcogenide (TMD) layer which is different from the second layer. Phosphorene is described in, for example, Liu et al., "Phosphorene: A New 2D Material with High Carrier Mobility," *ACS Nano*, 8, 4033-4041 (2014). If the first layer is a TMD layer, description for this first TMD layer is provided below for the second layer which is a TMD layer. In particular, graphene layers are preferred.

The first layer can be a monolayer or a few layered material. There can be, for example, 1 layer to 20 layers, or 1 layer to 10 layers, or 1 layer to 5 layers, or one layer, or two layers, or three layers, in the total first layer. The first layer thickness can be, for example, 20 nm or less, or about 10 nm or less, or about 0.3 nm to about 10 nm, or about 0.5 nm to about 10 nm, or about 1.0 nm to about 10 nm, or about 1.5 nm to about 10 nm or about 2 nm to about 6 nm, or about 4 nm. The minimum thickness for the layer can be, for example, 0.1 nm, or 0.2 nm, or 0.3 nm, or 0.4 nm, or 0.5 nm, or 0.6 nm, or 0.7 nm, or 0.8 nm, or 0.9 nm, or 1.0 nm.

The first layer can be patterned. Patterning can be carried out by, for example, beam lithography or photolithography. The first layer can be doped. The patterning can provide different domains or different layers separated from each other.

Graphene layers are known in the art, and the total thickness of the graphene layer can be varied. For example, they can be only one atomic layer thick or they can have n layers of graphene as in so-called few layered graphene. The number of graphene layers can be, for example, 1 layer to 20 layers, or 1 layer to 10 layers, or 1 layer to 5 layers. In one embodiment, the graphene layer is few layer graphene. Multi-layered graphene can be also formed. In another embodiment, the graphene layer has a thickness of about 0.3 nm to about 10 nm. The graphene layer thickness can be, for example, about 2 nm to about 6 nm, or about 4 nm. In another embodiment, the graphene layer is large area graphene. Each graphene layer can provide about 0.4 nm per layer for the total thickness.

In one embodiment, the graphene layer is patterned. Patterning can provide a sharp edge. The sharp edge, for example, can provide for further growth of the transition metal chalcogenide layer. Patterning provides a well-defined graphene domain on the substrate surface.

The graphene layer can be un-doped or it can be doped, including p-doped or n-doped. In one embodiment, the graphene layer is p-doped. In one embodiment, the graphene layer is heavily p-doped. In another embodiment, the graphene layer is lightly p-doped. In other embodiments, the graphene layer is n-doped, whether lightly n-doped or heavily n-doped. The graphene can be surface doped via surface adsorption. Also, graphene can be substitutionally doped where a carbon atom is replaced.

The graphene layer can be prepared by methods known in the art including chemical vapor deposition, electrochemical exfoliation, or mechanical exfoliation. Graphene layers also can be transferred from one substrate to another substrate.

The graphene layer can be a large area graphene including a wafer scale graphene layer. Roll-to-roll CVD growth can be carried out with transfer techniques to form graphene films which can have a length dimension of at least 1 inch, or at least ten inches, or at least 30 inches. See, e.g., Bae et al., *Nature Nanotechnology*, 2010, 5, 574.

Graphene layers are described in, for example, US Pat. Pub. 2015/0102807, including their use with metal chalcogenides.

Second Layer, Transition Metal Dichalcogenide (TMD) Layer

Transition metal dichalcogenide layers are known in the art (and can be called $MX_2$, wherein M is the transition metal and X is the chalcogen). They can be direct band gap semiconductors with bandgaps of about 0.7 eV to about 2.2 eV, or about 1.2 eV to about 1.8 eV. They can show n or p behavior. See, for example, Chhowalla et al., *Nature Chemistry*, 5, 263 (2013).

In one embodiment, the transition metal dichalcogenide layer is a sulfide, selenide, or telluride layer.

In one embodiment, the transition metal of the transition metal dichalcogenide is molybdenum, tungsten, titanium, zirconium, hafnium, vanadium, niobium, or tantalum.

In one embodiment, the transition metal dichalcogenide is molybdenum sulfide or tungsten selenide.

Specific examples include $MoS_2$, $WSe_2$, $MoSe_2$, $SnSe$, $SnSe_2$, $MoTe_2$, $WS_2$, $WTe_2$, $TiS_2$, $TiSe_2$, $TiTe_2$, $ZrS_2$, $ZrSe_2$, $ZrTe_2$, $HfS_2$, $HfSe_2$, $HfTe_2$, $VS_2$, $VSe_2$, $VTe_2$, $NbS_2$, $NbSe_2$, $NbTe_2$, $TaS_2$, $TaSe_2$ or $TaTe_2$.

As known in the art, the thickness of the transition metal dichalcogenide layer can be varied. In one embodiment, the layer has a thickness of 20 nm or less, or 10 nm or less, or about 0.5 nm to about 10 nm. The range in thickness can be, for example, 1 nm to 20 nm, or 1 nm to 10 nm, or 1 nm to 5 nm. The thickness can be, for example, about 0.5 nm to about 5 nm. In one embodiment, the transition metal dichalcogenide layer is a monolayer. The minimum thickness for the layer can be, for example, 0.1 nm, or 0.2 nm, or 0.3 nm, or 0.4 nm, or 0.5 nm, or 0.6 nm, or 0.7 nm, or 0.8 nm, or 0.9 nm, or 1.0 nm.

The second layer can be a monolayer or comprise multiple layers such as, for example, at least one layer, two layers, or at least two layers, or 1 layer to 15 layers, or 1 layer to 10 layers, or 1 layer to 5 layers.

Transition metal dichalcogenide layers can be prepared by vapor deposition whether by chemical vapor deposition or physical vapor deposition. Examples of chalcogenide (X) precursors include X, $H_2X$, and $(alkyl)_2X$ such as $(CH_3)_2X$, $(C_2H_5)_2X$, and $C_3H_8X$. Growth temperature can be, for example, 300° C. to 1,000° C., or 500° C. to 1,000° C. Growth pressure can be, for example, 10 mtorr to 760 torr.

The second layer can be doped.

Lateral Heterojunction(S) and Heterostructures

The device can provide for one, two, three, or more lateral heterojunctions based on the first and second layers. Lateral heterojunctions are known in the art and can be distinguished from vertical heterojunctions. The examples for the vertical heterojunctions include: Zhang et al., Nature.com, *Scientific Reports*, 4:3826, DOI: 10.1038/srep03826. described graphene layer stacked on $MoS_2$ layer. Nanosheets of graphene have been combined with nanosheets of $MoS_2$ as described in Zhou et al., *Chem. Commun.*, 2013, 49, 1838 for lithium storage. Graphene-like layered metal dichalcogenide/graphene composites are described in *Materials*

*Today*, 17, 4, 184, May 2014 in the context of applications in energy storage and conversion.

The at least one first layer (e.g., graphene layer) and the at least one layer of transition metal dichalcogenide can form at least one lateral heterojunction and, more particularly, a lateral penetrating heterojunction.

In one embodiment, the device comprises at least two first layers (e.g., two graphene layers), and each of the two first layers (e.g., graphene layers) are in contact with the layer of transition metal dichalcogenide to form at least two lateral heterojunctions, and in particular, at least two lateral heterojunctions, including at least two lateral penetrating heterojunctions.

In one embodiment, the first layer (e.g., graphene layer) stitched with the layer of transition metal chalcogenide laterally through edge contacting. The first layer is not overlapped with the layer of transition metal chalcogenide.

In one embodiment, the first layer is stacked with the layer of transition metal chalcogenide forming a multilayer stacking contact with a range of overlapped region. The layer of transition metal chalcogenide can be beneath or above the first layer at the overlapped region (FIG. 3(*b*)). The overlapped length can be, for example, 0 nm to 500 nm, or 1 nm to 500 nm, or 1 nm to 200 nm, or 1 nm to 100 nm, or 1 nm to 50 nm, or 1 nm to 20 nm, or one 1 nm to 10 nm, or 2 nm to 10 nm, or 1 nm to 5 nm or 2 nm to 5 nm, or 11 nm to 20 nm. Overlapped length can be determined by TEM analysis.

In one embodiment, the first layer is stacked with the layer of transition metal chalcogenide forming a multilayer stacking contact with a range of overlapped region. The first layer has an interlayer space and the layer of transition metal chalcogenide penetrates into the interlayer space, which is schematic illustrated in FIG. 5 for one embodiment (graphene on the left; $WSe_2$ on the right). This forms a lateral penetrating or interpenetrating heterojunction. The penetration length can be, for example, 1 nm to 500 nm, or 1 nm to 200 nm, or 1 nm to 100 nm, or 1 nm to 50 nm, or 1 nm to 20 nm, or one 1 nm to 10 nm, or 2 nm to 10 nm, or 1 nm to 5 nm or 2 nm to 5 nm, or 11 nm to 20 nm. Penetration length also can be determined by TEM analysis.

In one embodiment, the lateral heterojunction is a seamless heterojunction.

In one embodiment, the heterojunction is a monolayer heterojunction.

In one embodiment, the heterojunction is a few-layered (multi-layered) heterojunction.

Figure 9:
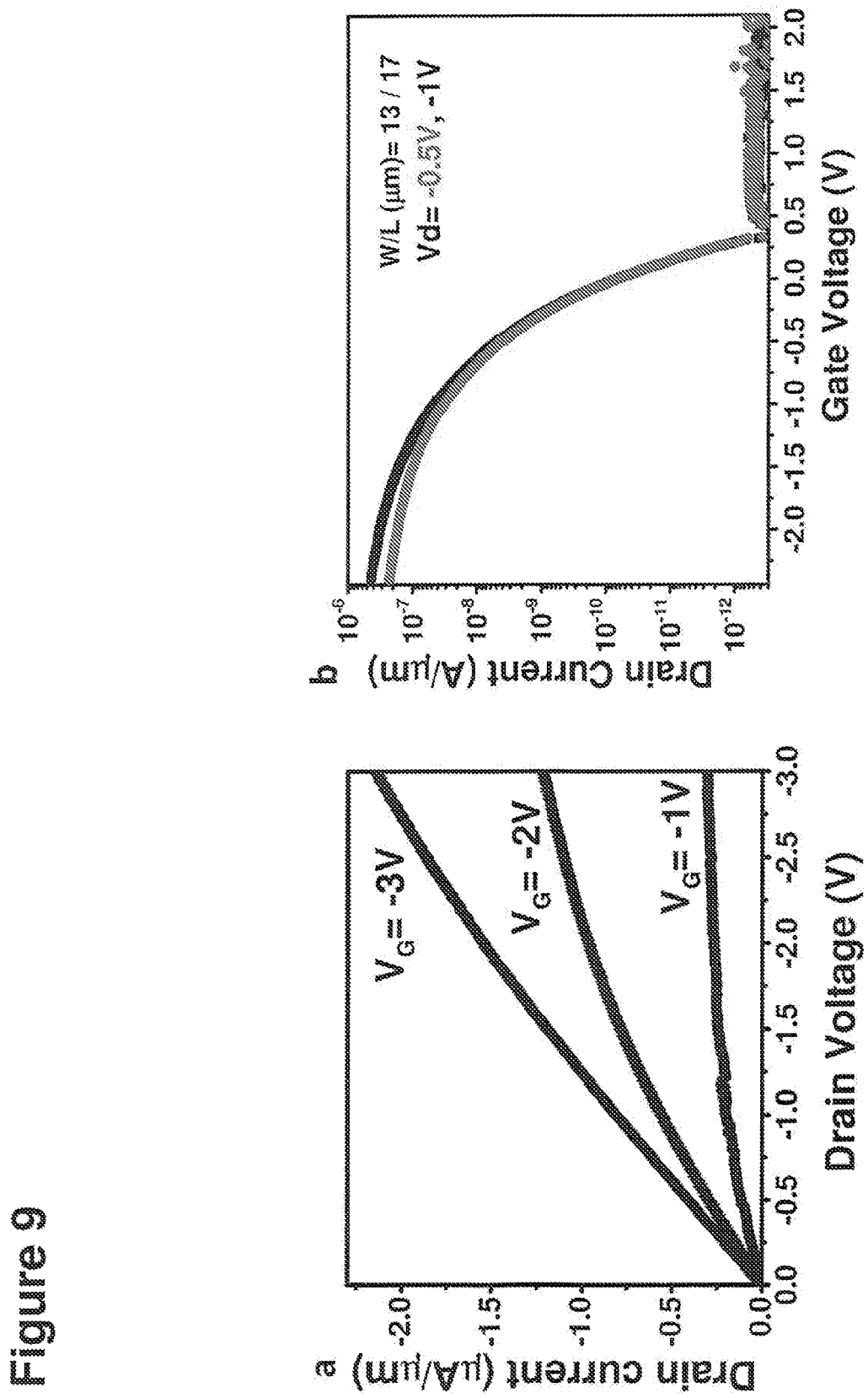
FIGS. 9(a)-(b). Additional transistor performance of p-sMLG-$WSe_2$ FET with (a) output curve and (b) transfer curve.
Figure 10:
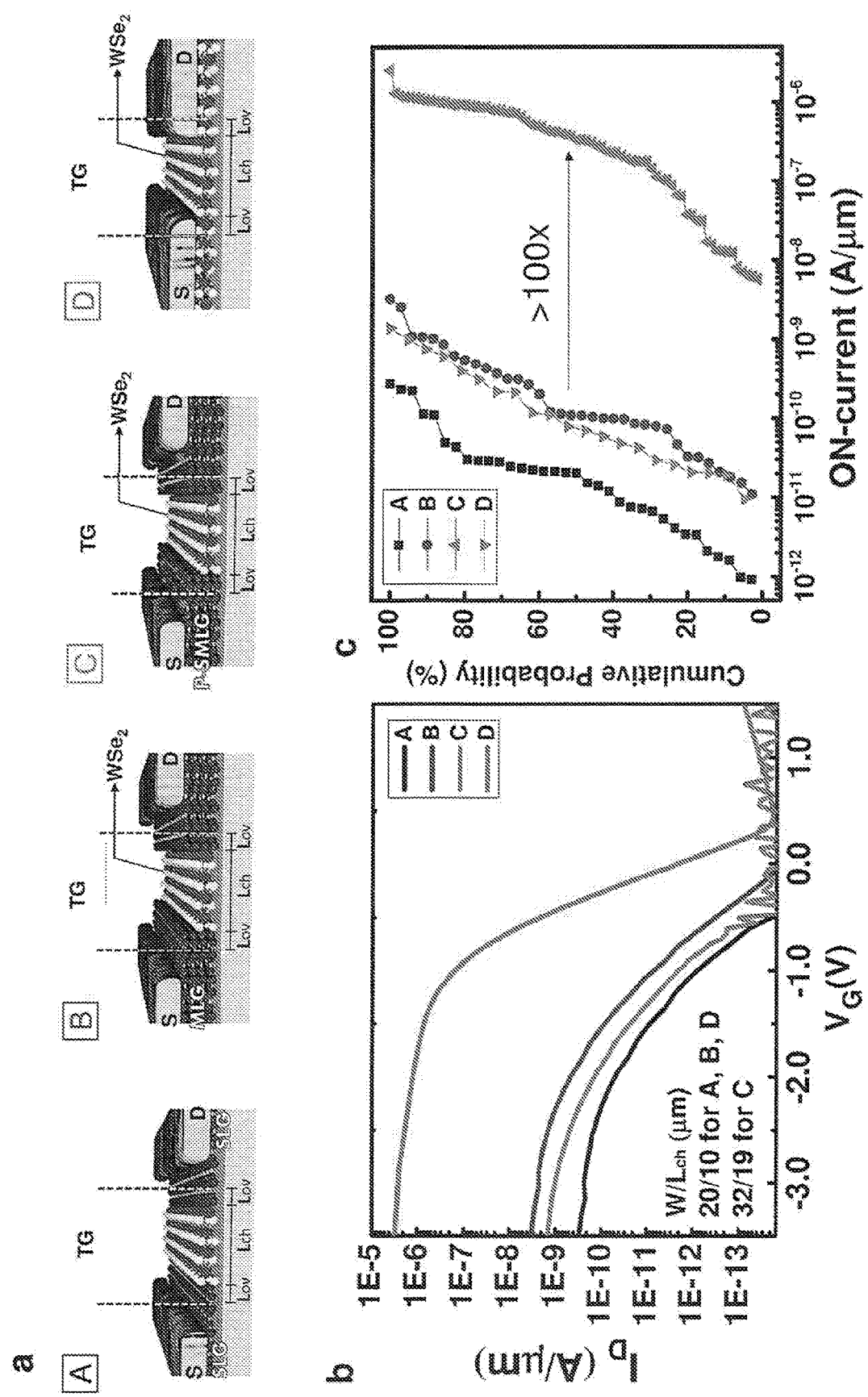
FIGS. 10(a)-(c). (a) Schematic illustration of the device structure. (b) The transfer curves and (c) the ON-current cumulative probability plot (at $V_G=-3V$) for various devices.
Figure 11:
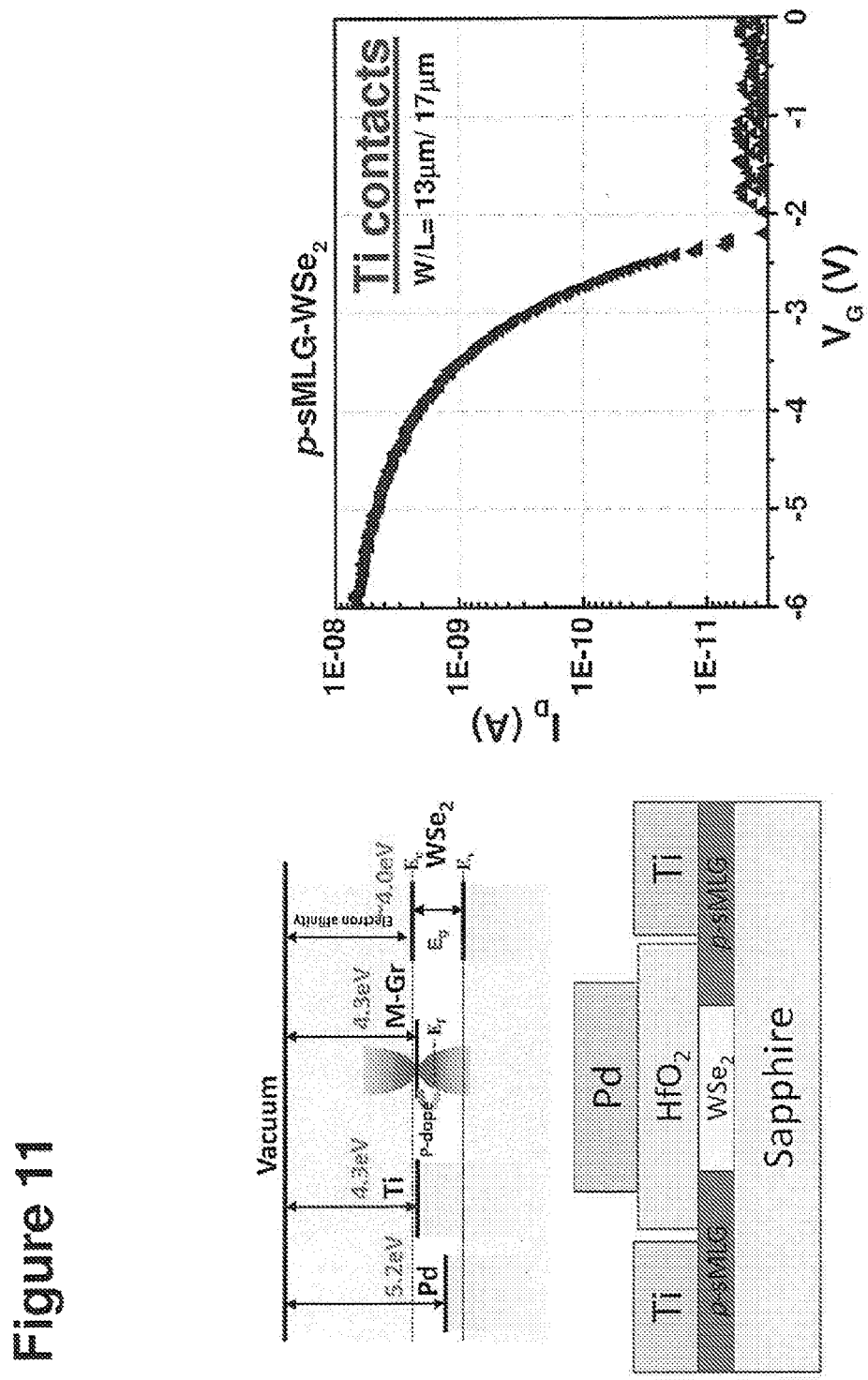
FIG. 11. The transfer curve of a $WSe_2$ p-FET with p-doped SMLG contacted by Ti electrode metal. Since the p-doped MLG is responsible for the preference of injection carrier type, unipolar p-type FET is always obtained even including a low work function metal Ti.

In one embodiment, the heterojunction shows ohmic contact behavior (see, for example, FIG. 9). In one embodiment, the second layer of transition metal chalcogenide and the first layer (e.g., graphene layer) are formed by chemical vapor deposition. Li et al., *Science*, 2015, 349, 524 TMD lateral heterostructures prepared by CVD.

Method of Making and Characterizing

Methods known in the art and described in the working examples can be used to prepare the various components of the layers, the junctions, the transistors, and the devices described herein. For example, microfabrication and/or patterning can be carried out through photolithography and/or etching processes (e.g., reactive ion etching or 02 plasma).

Also, for example, chemical vapor deposition and transfer methods can be used to form the first layer (e.g., graphene layer) and metal dichalcogenide layer. In a transfer method, a film or layer can be transferred from one substrate to another. For example, a film or layer prepared by CVD can be transferred. Substrates are known in the art and include, for example, sapphire, glass, polymer, kapton, polyimide, quartz, $SiO_2$/Si, silicon, GaN, GaAs, copper, and the like. PMMA-assisted transfer methods can be carried out.

Also, methods known in the art and described in the working examples can be used to characterize the various components of the layers, the junctions, the transistors, and the devices described herein.

To form heterojunctions of two materials, the first material on the substrate can be transferred or grown by CVD. The second material can be then grown by CVD. For example, graphene can be transferred onto a substrate as a first layer, and then a TMD layer can be grown. Alternatively, both materials can be grown by CVD.

Lateral heterojunction can be formed by controlling the CVD conditions of the second material to avoid vertical growth on the top of the first material.

CVD temperature can be, for example, 300° C. to 1,000° C., or 600° C. to 1,000° C. Pressure can range from 10 mtorr to 760 torr. The transition metal precursor is not limited but can be, for example, $MO_2$, $MO_3$, $M(CO)_6$, $MCl_3$, $MCl_4$, or $MCl_5$ (where M is the metal).

Devices and Applications

The lateral heterojunction structures described herein having low contact resistance can be used in various structures and devices including in, for example, ultra-thin semiconductor electronic or opto-electronic devices. Devices include, for example, p-n junction, bipolar junction transistor, MOSFET, LED, solar cell, laser, light detector, photodetector devices, and can be integrated to touch screen, transparent displays, and other similar integrated functions and devices. Flexible electronics, low power electronics, quantum computing, and valleytronics are other areas of application and devices. In particular, transistors and field effect transistors can be made. Various gate embodiments can be used including the top-gate arrangement. Insulators and conductors can be used as known in the transistor arts. High-K dielectric insulators (e.g., aluminum oxide, hafnium oxide) can be used.

Particular focus is placed on transistors having active components of very small size allowing for further miniaturization of electronic and opto-electronic devices.

For a channel layer, the length and width can be adapted for the need, whether nanoscale or microscale, depending on the lithography limitation, as known in the art. For example, about 2 nm by e-beam lithography to about 50 microns by photolithography.

Figure 12:
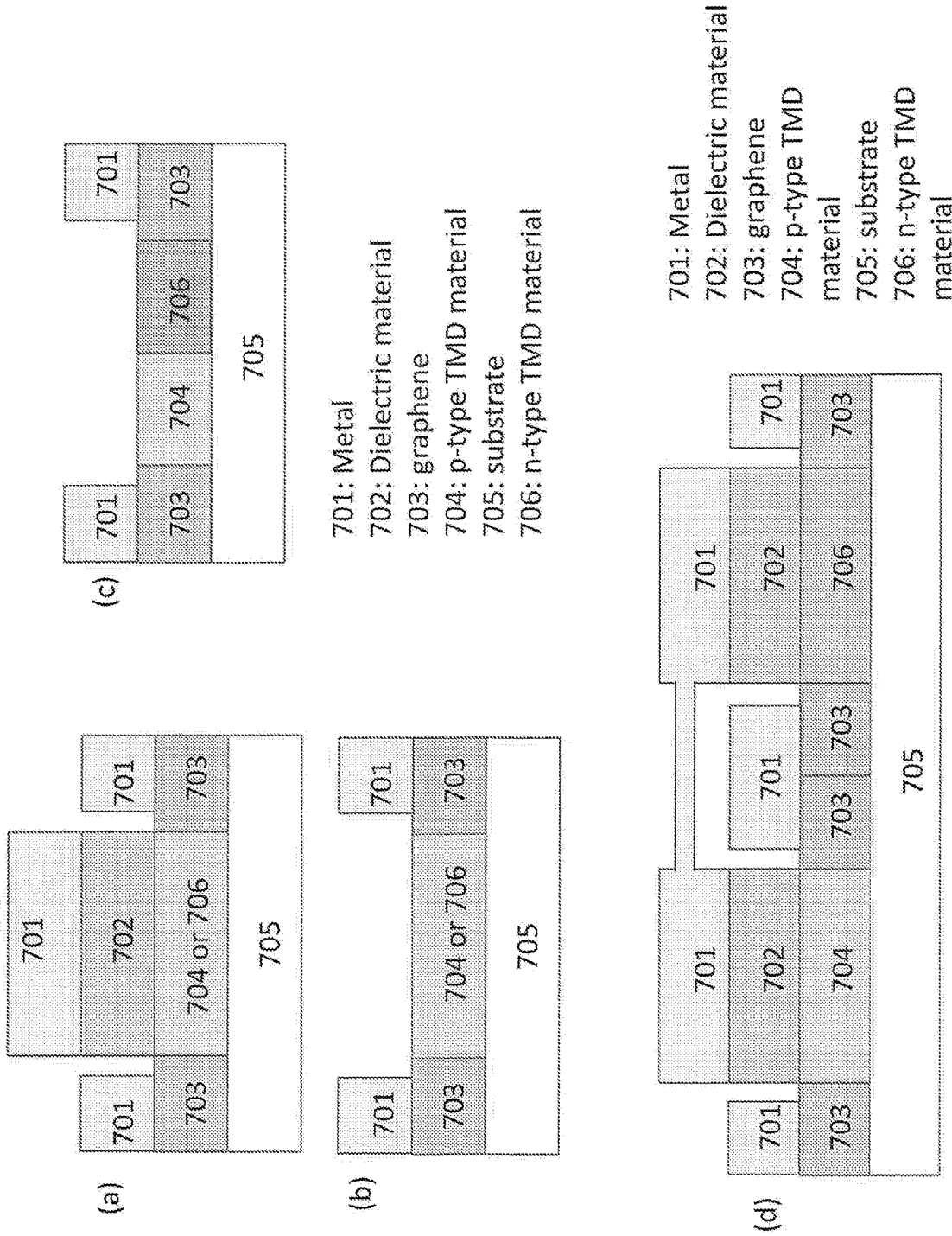
FIGS. 12(a)-(d) show some non-limiting examples of semiconductor devices.

FIGS. 12(*a*)-(*d*) show four additional examples of devices based on metal (701), dielectric material (702), graphene (703), p-type TMD material (704), n-type TMD material (706), and substrate (705).

The first layer can be in ohmic contact with any metal ranging from large work function metals to low work function metals.

Device Characteristics

Transistors, including field effect transistors, can be prepared and tested as known in the art. Transfer and output characteristics can be measured. Good properties and combination of properties can be achieved.

In one embodiment, for example, the device is a field effect transistor which has an $I_{on}/I_{off}$ ratio of about $10^4$ or more, or $10^5$ or more, or $10^6$ or more, or $10^7$ or more, or $10^8$ or more.

In one embodiment, the device is a field effect transistor which has a carrier mobility of about 10 $cm^2$/N-s or more at about 25° C., about 20 $cm^2$N-s or more at about 25° C., or about 30 $cm^2$N-s or more at about 25° C.

In one embodiment, the device is a field effect transistor which has an $I_{off}$ value of 10 pA or less.

In one embodiment, the device is a field effect transistor which has a subthreshold swing (SS) of about 130 mV/dec or less.

In one embodiment, the device is a field effect transistor which has an on state current of about 2.13 µA/µm or more, or 3 µA/µm or more.

In one embodiment, the graphene layer although doped has a thermal stability in annealing of at least 250° C., or at least 300° C., or at least 400° C., or at least 500° C.

Excluding Features

In some embodiments, features in the structures or methods can be excluded. For example, the phrases "consisting essentially of" or "consisting of" can be used to exclude features as known in the art. Basic and novel characteristics of the claimed inventions are described herein.

For example, in one embodiment, ionic liquid gating as described in the Chuang reference, and references cited therein (Perera et al., ACS Nano 2013, 7 (5), 4449), is not used. Hence, in one embodiment, the device does not comprise an ionic liquid. In another embodiment, the at least one graphene layer does not contact an ionic liquid. Also ionic gels can be excluded. Ionic gels are described in, for example, J. K. Huang et al., ACS Nano, 8, p. 923, 2014.

In one embodiment, mechanical or micromechanical exfoliation is not used to prepare the layers as described herein.

In one embodiment, $NO_2$ doping is not used.

Working Examples

Additional embodiments are provided by the following non-limiting working examples including cited references and the figures.

Growth of Lateral Graphene/$WSe_2$ Heterostructures:

FIG. 1 illustrates the methods of growing graphene [K. K. Kim et al., Nanotechnol., 21, p. 285205, 2010] and $WSe_2$ layers [J. K. Huang et al., ACS Nano, 8, p. 923, 2014] using chemical vapor deposition. As-grown large-area multilayer graphene (MLG) was transferred onto c-plane sapphire substrates using the PMMA-assisted transfer technique [Y. C. Lin et al., Nanoscale, 4, p. 6637, 2012]. Optical lithography and dry etching are used to form the desired graphene patterns. MLG-$WSe_2$ heterostructures are formed after growing $WSe_2$ monolayers to the regions without graphene, where a schematic illustration of the process is provided in FIG. 2a. The patterned graphene films occupy the left- and right-hand sides and the sapphire surface is exposed in the center region as shown in the optical micrograph in FIG. 2b. With the CVD growth (tungsten trioxide and selenium precursors are used for the CVD growth under Ar/$H_2$), the $WSe_2$ monolayer selectively fills the center region and there is no visible gap as shown in FIG. 2c. The photoluminescence and Raman spectroscopies are adopted to characterize the MLG-$WSe_2$ heterostructures. FIGS. 2d and 2e are the Raman intensity mappings for the G band (1577 cm$^{-1}$) of graphene and the degenerate E' and A'$_1$ bands for $WSe_2$ respectively. These mappings prove that $WSe_2$ exists only in the center region but not on the top of the graphene layers. FIG. 2f compares the single point Raman spectra of MLG before (curve i, as-patterned graphene) and after (curve ii, graphene with $WSe_2$ stitched laterally) the area-selective $WSe_2$ growth. The Raman peak height ratio of 2D/G (<1) in the curve i corroborates that the as-patterned graphene is multilayered. An obvious and broad D band emerges at about 1350 cm$^{-1}$ after the growth of $WSe_2$, which is attributed to the conversion of residual photoresists (used for MLG patterning) to amorphous carbon formed after the high temperature process. FIG. 2g shows the photoluminescence peak at 1.62 eV, and FIG. 2h displays the degenerate Raman E' and A'$_1$ modes for $WSe_2$ at 250 cm$^{-1}$, indicating that the $WSe_2$ grown in the channel area is a monolayer.

Figure 3:
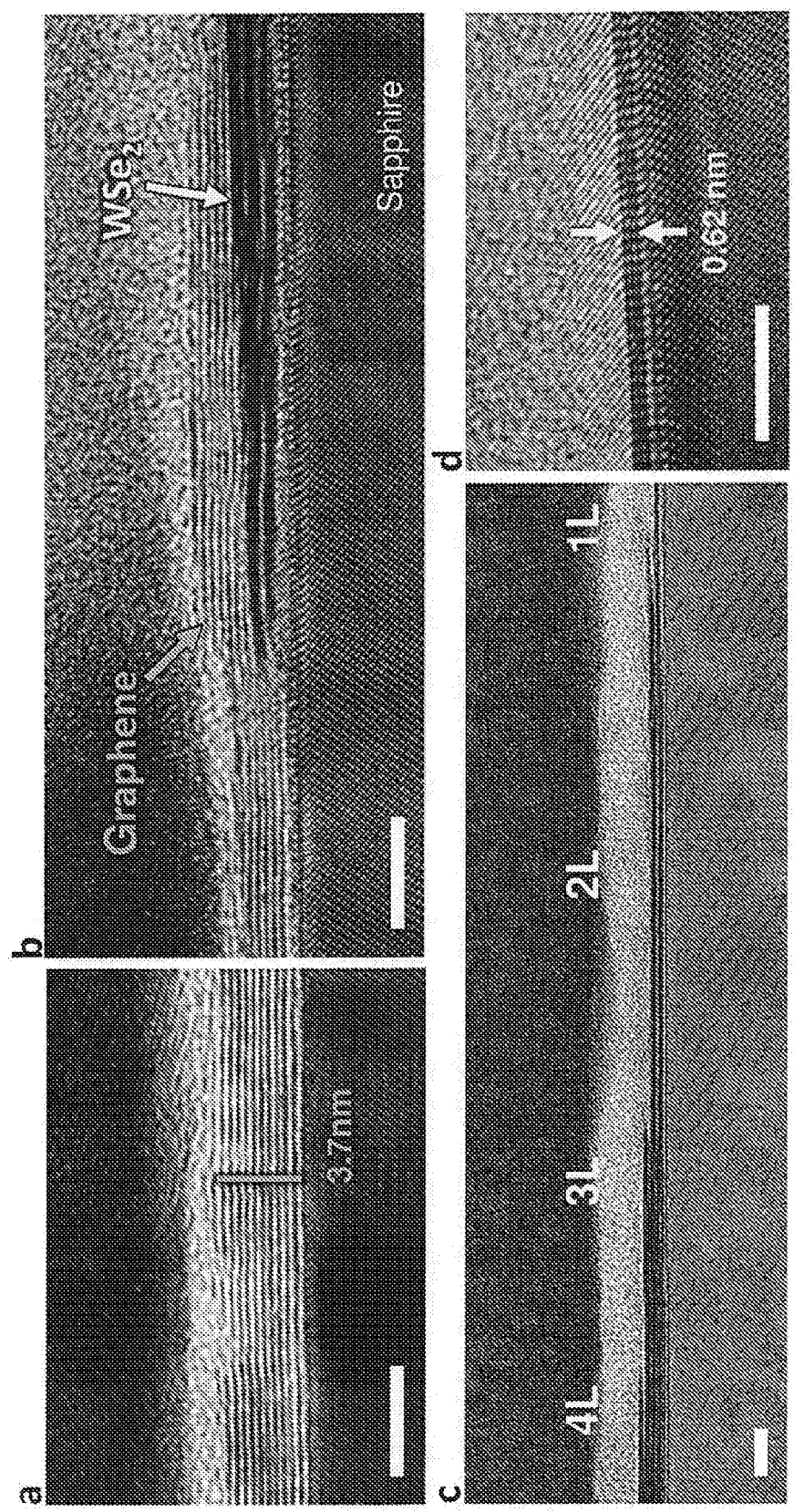
FIGS. 3(a)-(d). The cross-sectional high-resolution TEM images of (a) the MLG region. (b) The overlapped MLG-$WSe_2$ heterojunction region. (c) The $WSe_2$ few layers near the junction transit to a monolayer once the location is away from the junction. (d) The monolayer $WSe_2$ channel region. The scale bars are 5 nm.
Figure 4:
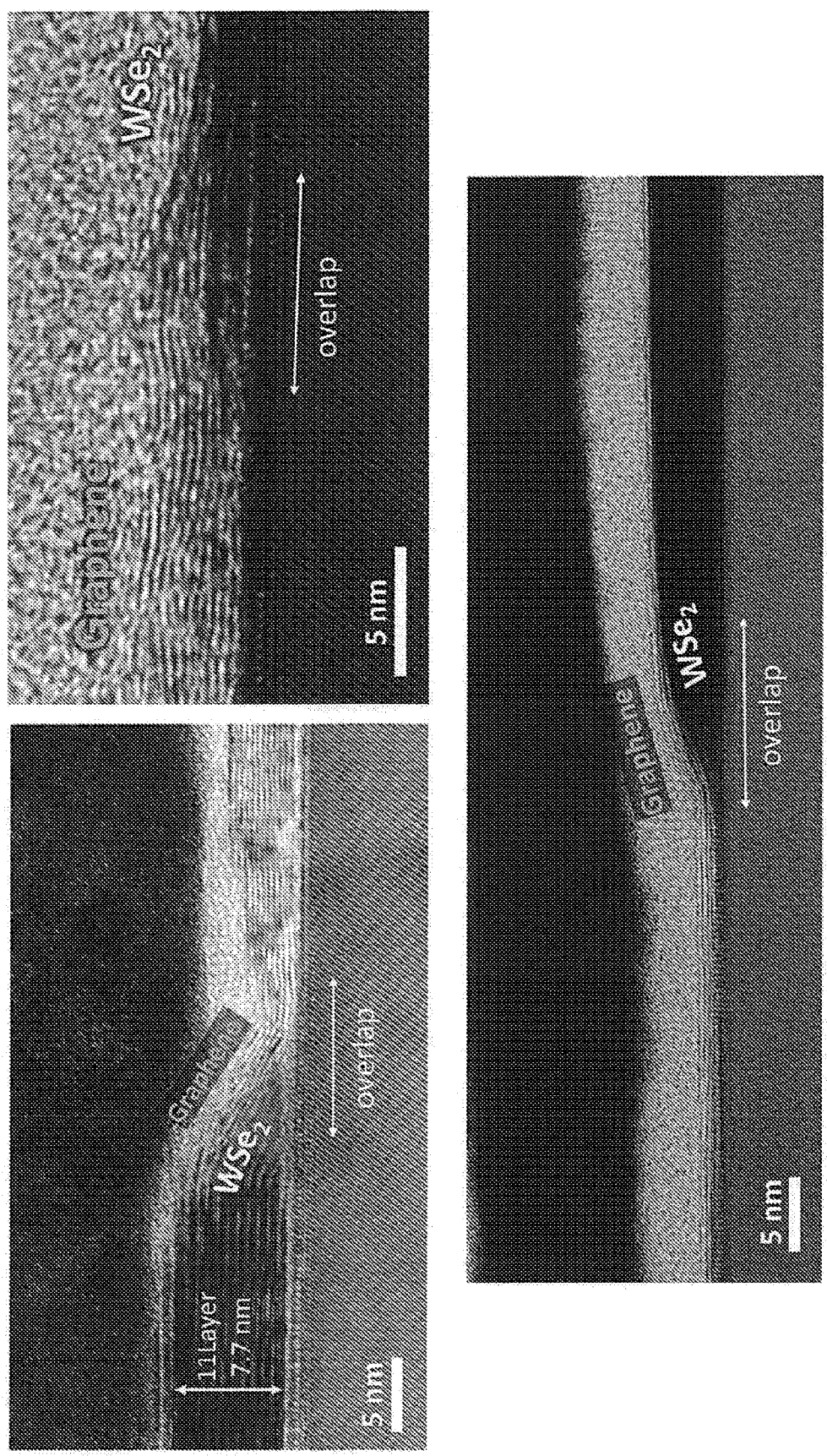
FIG. 4. Additional cross-sectional HR-TEM images presenting MLG-$WSe_2$ heterojunction.
Figure 5:
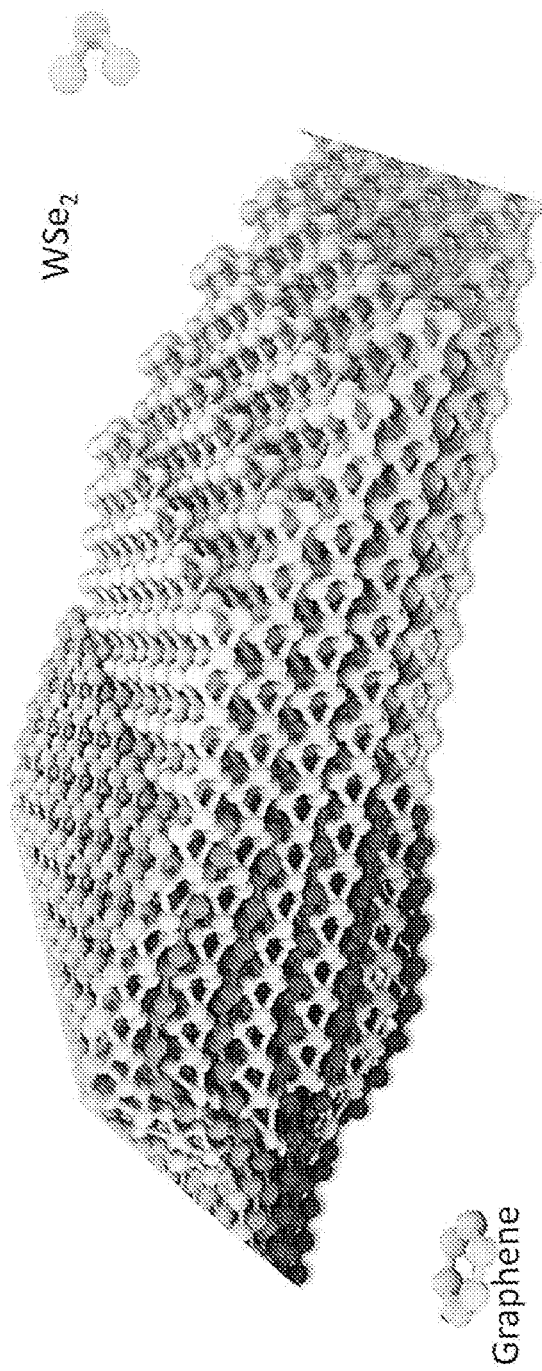
FIG. 5. Schematic illustration of the layer of transition metal chalcogenide penetrates into the interlayer space of the first layer (MLG).
Figure 6:
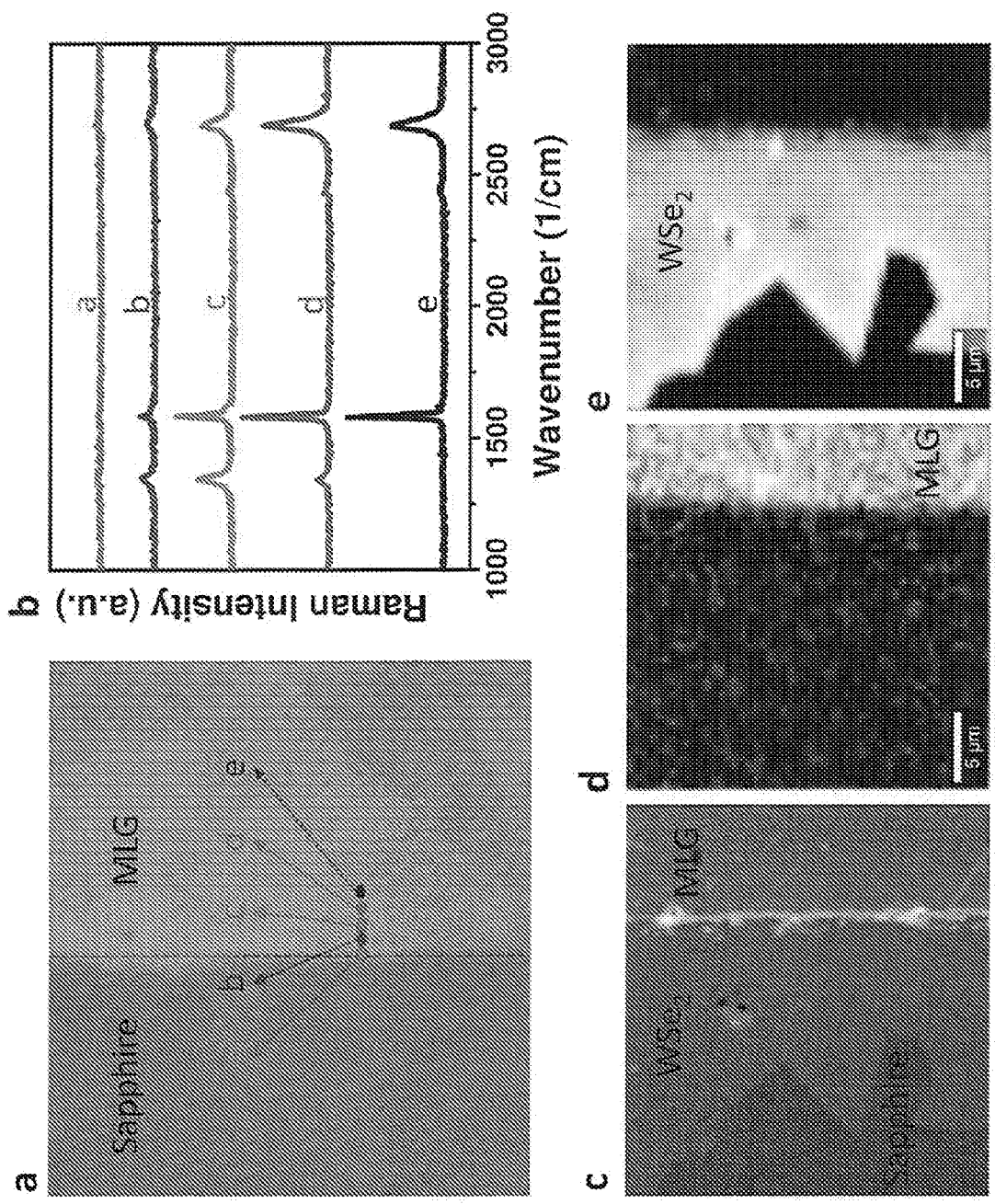
FIGS. 6(a)-(e). (a) Optical image of as-patterned MLG. (b) Raman spectra taken along a line from sapphire to MLG as marked in (a). (c) Optical image of the MLG-$WSe_2$ heterojunction. Corresponding Raman spatial mappings for the integrated intensity of (d) graphene G band and (e) degenerate E' and $A'_1$ modes of $WSe_2$. (c)-(e) show that the $WSe_2$ grows from graphene edge and forms a seamless lateral heterojunction.

FIG. 3 displays that the graphene film is 3.7 nm thick (ten graphene layers). Few-layered $WSe_2$ is found at the patterned graphene edge, and $WSe_2$ growth is more likely to penetrate into the space between MLG and sapphire substrate, forming a thicker overlapped junction as shown in FIG. 3(b). The overlapped (vertically stacked) region is around tens of nanometers. Additional junction cross-section images are provided in FIG. 4. Out of overlap region, the layer number of $WSe_2$ gradually reduces from few-layers at the junction to a monolayer when the location is away from the junction. The layer number near the junction at the left of FIG. 2(c) is 4 and reduces layer by layer until it totally transits to a monolayer at the channel region.

FIG. 6(b) shows the Raman line scan is carried out for the 5 locations from sapphire to the MLG region crossing the patterned edge as marked in FIG. 6(a). First, no Raman signal is observed on the exposed sapphire at location a. Then the graphene characteristic peaks, G and 2D bands, are observed near the patterned graphene edge at the locations b, c and d. The presence of a pronounced D band at 1350 cm$^{-1}$ indicates that the $O_2$ plasma bombardment induces structural change of graphene while it disappears in location e once the location is away from the edge (only G and 2D band remained). The defects at the patterned MLG edges may provide many nucleation sites for the multilayer $WSe_2$ growth. One can observe the triangular $WSe_2$ grains along the graphene using optical microscope (FIG. 6(c)). Raman spatial mappings of 2D band in graphene and degenerate E' and A'1 modes in $WSe_2$ are provided to confirm the distribution of two materials (FIG. 6(d) and FIG. 6(e)). One can conclude that a seamless MLG-$WSe_2$ lateral junction is formed.

Figure 7:
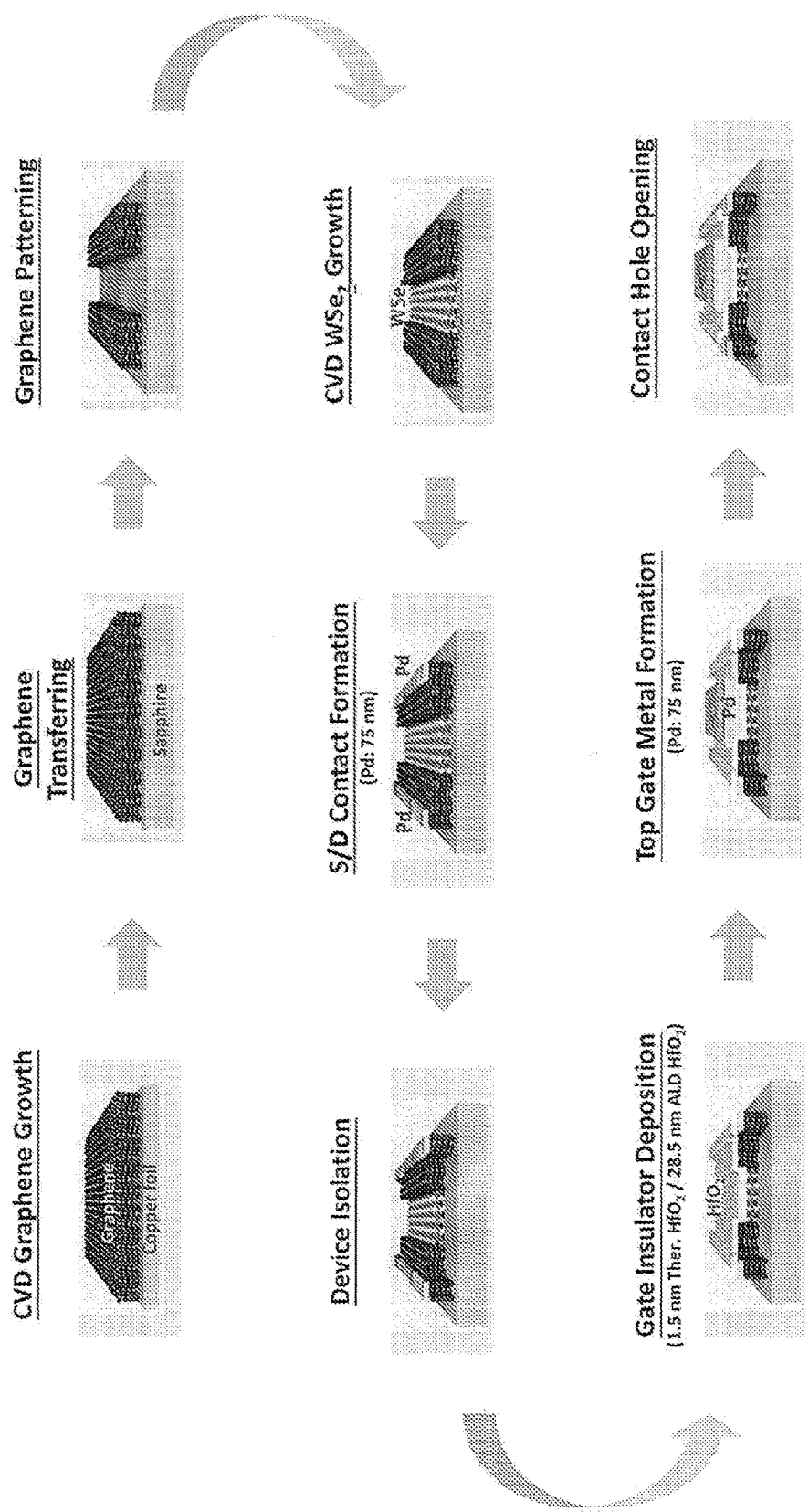
FIG. 7 shows the fabrication processes for a top-gated transistor based on the graphene-$WSe_2$ lateral heterostructure.

Device Fabrication:

FET devices based on the graphene/$WSe_2$ lateral junction structures were fabricated. FIG. 7 details the process flow, where the graphene layers are the actual S and D materials and the Pd evaporated on graphene is used for electrical probing.

Figure 8:
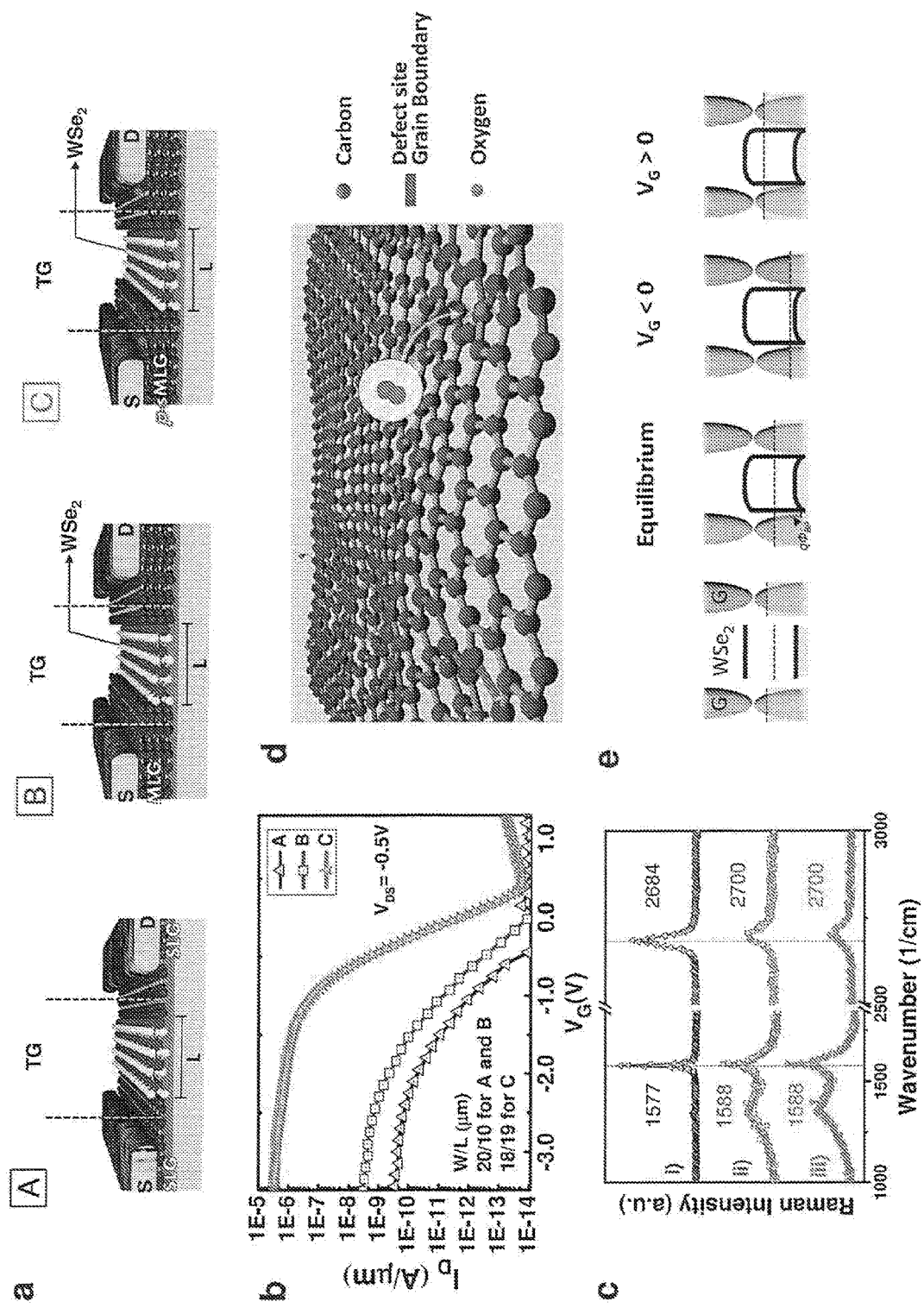
FIGS. 8(a)-(e) show the electrical characteristics of the graphene-$WSe_2$ lateral heterostructure. (a) Transistor geometry of single layer graphene (SLG), multilayer graphene (MLG) and p-doped small grain multilayer graphene (sMLG) source/drain defined as scheme A, B and C respectively. (b) The transfer curves of the transistors comparing SLG (Scheme A), MLG (Scheme B) and p-doped sMLG (Scheme C). (c) Raman spectra for the sMLG: i, as-patterned; ii, after $WSe_2$ growth; iii, after 300° C. annealing of doped sMLG-$WSe_2$ in air for 1 hr. (d) The schematic doping effect takes place at defect sites or the grain boundaries (e) The schematic band diagram of the p-doped sMLG-$WSe_2$ junction.

Electrical Characteristics:

To explore the electrical performance of the graphene-$WSe_2$ heterojunction, the $WSe_2$ transistors using SLG (single layer graphene) and MLG S/D are fabricated, where FIG. 8(a) schemes A and B represent the SLG-$WSe_2$ and MLG-$WSe_2$ respectively. An $HfO_2$ gate dielectric layer (1.5 nm of $HfO_2$ deposited by e-gun followed by 28.5 nm of $HfO_2$ by ALD) and a Pd gate metal (75 nm) were deposited for top-gate FET geometry with the channel width (W) of 20 µm and length (L) of 10 µm. The top gate metal has 5 µm overlap to both the MLG and SLG graphene S/D. Transfer curves for schemes A and B both exhibit p-type transport behaviors as shown in FIG. 8. The on-state current of the device from scheme B (MLG) is one order of magnitude larger than that from scheme A (SLG). The resistance between the metal and the graphene film is very small and negligible, therefore the graphene-$WSe_2$ junction resistance ($R_j$) plays a crucial role in the electrical transport characteristics. The $R_j$ of the device are extracted by the Y-function method (H.-Y. Chang et al., Appl. Phys. Lett. 2014, 104, 113504) and the $R_j$ from scheme B ($1.5 \times 10^7$ Ω·µm) is about 16 times smaller than that from scheme A ($2.4 \times 10^8$ Ω·µm). The hole barrier at the MLG-$WSe_2$ junction is lower likely due to the following reasons (1) a higher carrier concentration of MLG, (2) a high carrier concentration and the smaller band gap of few-layered WSe$_2$ at the contact region.

Doping of MLG for Enhancing Device Performance

For the typically grown and patterned MLG (with the average grain size around 20 μm), the Raman G and 2D bands at 1577 cm$^{-1}$ and 2689 cm$^{-1}$, do not show any obvious shift after the WSe$_2$ growth. However, one observed that the MLG having a smaller grain size (around 3 um; abbreviated as sMLG) tends to be p-doped after WSe$_2$ growth, evidenced by the blue shift in Raman features observed in both G band (from 1577 cm$^{-1}$ to 1588 cm$^{-1}$) and 2D band (from 2684 cm$^{-1}$ to 2700 cm$^{-1}$) as shown in FIG. 8(c) curve ii. The curve i is the Raman before WSe$_2$ growth for comparison. The doping effect is suggested taking place along the grain boundaries or at some defect sites (FIG. 8(d)). One can perform a separate experiment to verify that the doping is likely caused by the unintentional oxidation, where the oxygen source may come from the unavoidable air leak in CVD systems. Interestingly, the p-doping phenomenon in sMLG remains stable even after the sMLG-WSe$_2$ structure is annealed at 300° C. in ambient air for 1 hr, as proved by the unchanged Raman features (curve iii). Therefore, the following electrical measurement is retained in ambient air at room temperature.

The field effect transistor based on the doped sMLG-WSe$_2$ heterojunction is fabricated with W/L=18/19 μm named Scheme C in FIG. 8(a). Since the oxygen doping withdraws electrons and thereby shifts the Fermi level of sMLG downward with respect to the its mid-gap (The qualitative illustration of the band diagram is shown in FIG. 8(e)), the hole barrier is reduced at sMLG-WSe$_2$ junction. The on-state current, red curve of FIG. 8(b) with $I_{on}/I_{off}$ ratio exceeds $10^7$, is enhanced at least by two orders of magnitude compared with the undoped case (Scheme B). The enhancement is even more than 1000 times larger than the Scheme A. Additional transfer and output curves of Scheme C are provided in FIGS. 9(a) and 9(b). The $R_j$=4.9×10$^4$ Ω·μm for the scheme C is 100 times and 1000 times smaller than the scheme B and scheme A respectively. A low-field mobility p (about) 84 cm$^2$/V s is also extracted based on the Y-function ($I_D/\sqrt{g_m}$) method at $V_{DS}$=−0.5V. The $C_{ox}$=5.5×10$^{-7}$ F/cm$^2$ is the calculated gate oxide capacitance for 30 nm of HfO$_2$. The performance is comparable (in the same order) to the reported results using other high mobility approach. One can also separately prepare and discuss WSe$_2$ transistors directly contacted to the conventional metal (FIG. 10), where a multilayered stacking heterojunction, Scheme B or C, exhibits better performance than the pure metal junction (Scheme D). Therefore, one can conclude that the MLG heterojunction can reduce the contact resistance. On the other hand, the p-doped graphene S/D actually govern the polarity of the transistor regardless of metal WF; for example, the unipolar hole transport is obtained (FIG. 11) even a low WF electrode Ti is used (4.3 eV, close to the conduction band of WSe$_2$ at ~4.0 eV). Note that the devices formed using this approach demonstrates quite consistent unipolar behaviors, different from the reported ambipolar WSe$_2$ FETs which are strongly affected by the metal WF (H. Fang et al., *Nano Lett.* 2012, 12, 3788-3792).

What is claimed is:

1. A device comprising:
   at least one first layer, wherein the first layer has a thickness of 20 nm or less;
   at least one second layer, different from the first, which is a transition metal dichalcogenide layer, wherein the second layer has a thickness of 20 nm or less,
   wherein the at least one first layer and the at least one second layer form at least one lateral heterojunction, and
   wherein the at least one lateral heterojunction is a lateral penetrating heterojunction.

2. The device of claim 1, wherein the lateral penetrating heterojunction has a penetration length from 1 nm to 500 nm.

3. The device of claim 1, wherein the lateral heterojunction has an overlapped length from 0 nm to 500 nm.

4. The device of claim 1, wherein the lateral heterojunction has an overlapped length from 1 nm to 500 nm.

5. The device of claim 1, wherein the first layer is a graphene layer, a boron nitride layer, a phosphorene layer, or a transition metal dichalcogenide layer that is different from the second layer.

6. The device of claim 1, wherein the first layer is an un-doped graphene layer, a p-doped graphene layer, or an n-doped graphene layer.

7. The device of claim 1, wherein the first layer is a p-doped graphene layer or an n-doped graphene layer, and the second layer is a p-type transition metal dichalcogenide or an n-type transition metal dichalcogenide.

8. The device of claim 1, wherein the device comprises at least two domains for the first layer and each of the two domains are in contact with the second layer of transition metal dichalcogenide to form at least two lateral heterojunctions.

9. The device of claim 1, wherein the device comprises at least two domains for the first layer and each of the two domains are in contact with the second layer of transition metal dichalcogenide to form at least two lateral interpenetrating heterojunctions.

10. The device of claim 1, wherein the device comprises at least two domains for the first layer, wherein one of the two domains is in contact with the second layer which is an n-type second layer, and the other of the two domains is in contact with the second layer which is a p-type second layer.

11. The device of claim 1, wherein the device is a transistor, a photo-sensor, a solar cell, or a light-emitting diode.

12. A method of making a device, the method comprising:
   forming at least one first layer on a substrate;
   forming at least one second layer, which different from the first layer, the at least one first layer and the at least one second layer forming at least one lateral heterojunction,
   wherein the at least one second layer is a transition metal dichalcogenide layer, and
   wherein the at least one lateral heterojunction is a lateral penetrating heterojunction.

13. The method of claim 12, wherein the at least one second layer is formed by chemical vapor deposition or physical vapor deposition, and the at least one first layer is formed by patterning.

14. The method of claim 13, wherein the formation of at least one first layer by patterning comprises dry etching or wet etching.

15. A semiconductor device, comprising:
   a substrate;
   a transition metal dichalcogenide layer arranged on the substrate;
   a first layer arranged on the substrate, the first layer comprising a first part laterally arranged on a first side of the transition metal dichalcogenide layer and a second part laterally arranged on a second side of the transition metal dichalcogenide layer, wherein the first and second sides of the transition metal dichalcogenide layer are laterally opposite of each other, wherein the first layer and the transition metal dichalcogenide layer form a lateral penetrating heterojunction;

a gate insulator arranged on top of the transition metal dichalcogenide layer and the first layer; and a top gate arranged on the gate insulator.

16. The semiconductor device of claim 15, wherein the first layer is a graphene layer, a boron nitride layer, a phosphorene layer, or a further transition metal dichalcogenide layer that is different from the transition metal dichalcogenide layer.

17. The semiconductor device of claim 15, further comprising:

first and second metal contacts respectively arranged on the first and second parts of the first layer.

18. The semiconductor device of claim 15, wherein the first layer is an un-doped graphene layer, a p-doped graphene layer, or an n-doped graphene layer.

19. The semiconductor device of claim 15, wherein the first layer is a p-doped graphene layer or an n-doped graphene layer, and the transition metal dichalcogenide layer is a p-type transition metal dichalcogenide or an n-type transition metal dichalcogenide.

\* \* \* \* \*